United States Patent
Suzuki

[11] Patent Number: 5,877,648
[45] Date of Patent: Mar. 2, 1999

[54] INTEGRATED CIRCUIT HAVING A CONTROL CIRCUIT FOR CONTROLLING CONNECTION OF MONITOR POINTS TO ELECTRODE PADS

[75] Inventor: Tamotsu Suzuki, Kyoto, Japan

[73] Assignee: Rohm Co., Ltd., Kyoto, Japan

[21] Appl. No.: 879,810

[22] Filed: Jun. 20, 1997

[30] Foreign Application Priority Data

Jun. 20, 1996 [JP] Japan .................................. 8-160017

[51] Int. Cl.⁶ .................................................. H03K 17/28
[52] U.S. Cl. ......................... 327/401; 327/403; 327/407; 324/73.1; 371/22.36
[58] Field of Search .............................. 327/99, 407–413, 327/400, 401, 403; 324/73.1, 158.1; 371/22.36, 22.5, 22.6; 365/201

[56] References Cited

U.S. PATENT DOCUMENTS

| | | | |
|---|---|---|---|
| 5,256,964 | 10/1993 | Ahmed et al. | 324/73.1 |
| 5,418,452 | 5/1995 | Pyle | 324/73.1 |
| 5,673,274 | 9/1997 | Yoshida | 371/22.1 |
| 5,703,884 | 12/1997 | Ozaki | 371/22.3 |

*Primary Examiner*—Kenneth B. Wells
*Attorney, Agent, or Firm*—Nikaido, Marmelstein, Murray & Oram LLP

[57] ABSTRACT

A functional circuit is formed in a chip. A selector circuit is provided, which connects monitor points to electrode pads for external connections for testing the monitor points of the functional circuit. A control circuit is provided for supplying to the selector circuit a control signal which determines whether or not the monitor point is to be connected to the electrode pad by the selector circuit. The control circuit includes a counter circuit having a plurality of cascade-connected flip-flops, a clock signal input terminal for supplying a clock signal to each of the flip-flops in sequence from the flip-flop at an end of the counter circuit, and a reset signal input terminal for supplying a reset signal.

6 Claims, 3 Drawing Sheets

INTEGRATED CIRCUIT HAVING A CONTROL CIRCUIT FOR CONTROLLING CONNECTION OF MONITOR POINTS TO ELECTRODE PADS

BACKGROUND OF THE INVENTION

This invention relates to a semiconductor integrated circuit having a functional circuit as a substantive circuit, a selector circuit for connecting a particular point of that circuit to an electrode pad for external connection, and a control circuit for controlling the selector circuit, and more particularly, to a semiconductor integrated circuit which can reduce the chip size by simplifying the control circuit.

Conventionally, in a semiconductor integrated circuit having a complicated circuit such as a logical circuit formed within one chip, after making a semiconductor chip after design, principal points as testing points (hereinafter also called as monitor points) in a functional circuit are connected to electrode pads for external connection so that each circuit portion is tested whether it is normal or not. For doing this, the semiconductor integrated circuit is built, in addition to the substantive functional circuit, with a test circuit forming test line for connecting a monitor point to an electrode pad for external connection, a selector circuit for switching over connections between a test line and a substantive circuit line, and a control circuit for controlling the operation of the selector circuit. The semiconductor integrated circuit provided with such a test circuit like this has electrode pads 12 formed around a circuit section 11 forming an integrated circuit, as its concept diagram of an example of arrangement is shown in FIG. 3(a). In this circuit section 11 is formed with a monitor point 13, as one portion 11a of its one example is shown in FIG. 3(b), a test line 14 for leading the monitor point 13 to an outside, and a selector circuit 16 for selecting between the test line 14 and an line 15 of the substantive circuit, wherein the selector circuit 16 is constituted by a switching element 16a and a NOT circuit 16b for inverting a control signal. Incidentally, 17 is a test control terminal for inputting a control signal for controlling the selector circuit 16.

The control signal for controlling the selector circuit 16 through the test control terminal 17 is formed by a shift register 18 and a latch circuit 19, as shown in FIG. 3(c). The shift register 18 is provided with a data DAT input terminal and a clock CLK signal input terminal, while the latch circuit 19 is provided with a latch enable LE input terminal and a reset signal RST input terminal. This example of the control circuit structured by the shift register 18 and the latch circuit 19 provides many and sequential test outputs by merely applying data in sequence to the circuit shown in FIG. 3(c), i.e., by supplying four terminals of the shift register 18 and the latch circuit 19 with respective signals DAT, CLK, LE and RST, particularly where the circuit is made on a large scale basis to have increased number of monitor points, i.e., outputs for testing. Thus, by increasing the number of the test control terminal 17, the selector circuit 16 can appropriately be controlled on such large-scaled integrated circuit.

As stated before, in the test circuit of the conventional semiconductor integrated circuit, a shift register and a latch circuit are used to cope with increase of integration scale in semiconductor integrated circuits. In such cases, however, the four control-signal input terminals, a shift register, and a latch circuit are requisite for conducting a test. To this end, there is a problem that the chip area for a semiconductor integrated circuit increases to leave a cause of cost rising.

Furthermore, these control-signal input terminals or the circuits are portions having no bearing on a user side who utilize a semiconductor integrated circuit. Nevertheless, these portions result in increase in chip area. A problem also lies in that the presence of such test control terminals is inconvenient in packaging and mounting of a semiconductor integrated circuit.

SUMMARY OF THE INVENTION

It is the object of the present invention to provide a semiconductor integrated circuit which has, as the conventional has, a functional circuit and a test circuit arranged in a small chip area by effectively reducing the test circuit area and test control terminals, even where a semiconductor integrated circuit has many test outputs required for largely-integrated and complicated circuits.

A semiconductor integrated circuit of the present invention comprises:

a functional circuit formed in a chip;

a selector circuit for connecting monitor points in the functional circuit to electrode pads for external connection, when testing;

a control circuit for supplying to the selector circuit a control signal representative of whether or not the monitor points are to be connected by the selector circuit to the electrode pads;

wherein the control circuit has a counter circuit having a plurality of cascade-connected flip-flops, a clock signal input terminal for supplying a clock signal to the flip-flops in sequence starting from a flip-flop at a forward end in the counter circuit, a reset signal input terminal for supplying a reset signal.

A gate circuit may be provided which has input sides connected to the respective clock signal and reset signal input terminals so that a clock signal is supplied to the flip-flops only where a test is conducted by a reset signal. With such structure, the selector circuit can be controlled only where resetting is done with the reset signal.

The selector circuit may comprise a plurality of switching elements, each of the switching elements is connected between each of the monitor points and each of the electrode pads, the each output of the flip-flops is connected to each of the switching elements, wherein the monitor points are connected to the electrode pads based on the outputs of each of the flip-flops.

The switching elements may be formed for example by a first AND circuit having inputs for an output of the flip-flops and the monitor points, and a second AND circuit having inputs for an inverted output of the flip-flops and an output of the functional circuit, and an OR circuit for outputting an outputted side of the first and second AND circuits.

A decoder circuit may be connected between the control circuit and the selector circuit, the decoder circuit inputting thereto an output of each of the flip-flops so that an n-th output only is rendered as a high signal correspondingly to the number of pulses "n" of a clock signal inputted to the control circuit. The output from monitor points requiring testing can be taken one by one, enhancing efficiency for inspection.

A plurality of outputs of the selector circuit may be delivered to one of the electrode pads, the outputs of the selector circuit being synchronized with a clock signal inputted to the control circuit to be time-dividedly outputted, whereby each of the monitor points can be detected on the one of the electrode pads. The output terminals for inspection can be reduced by grouping. Accordingly, there becomes no necessity of increasing electrode pads to output terminals for inspection even for a semiconductor integrated circuit integrated on a large scale.

The abovestated object, other objects, features and advantages of this invention will be more apparent from the following description on examples with reference to the accompanying drawings.

DETAILED DESCRIPTION OF THE INVENTION

Figure 1:
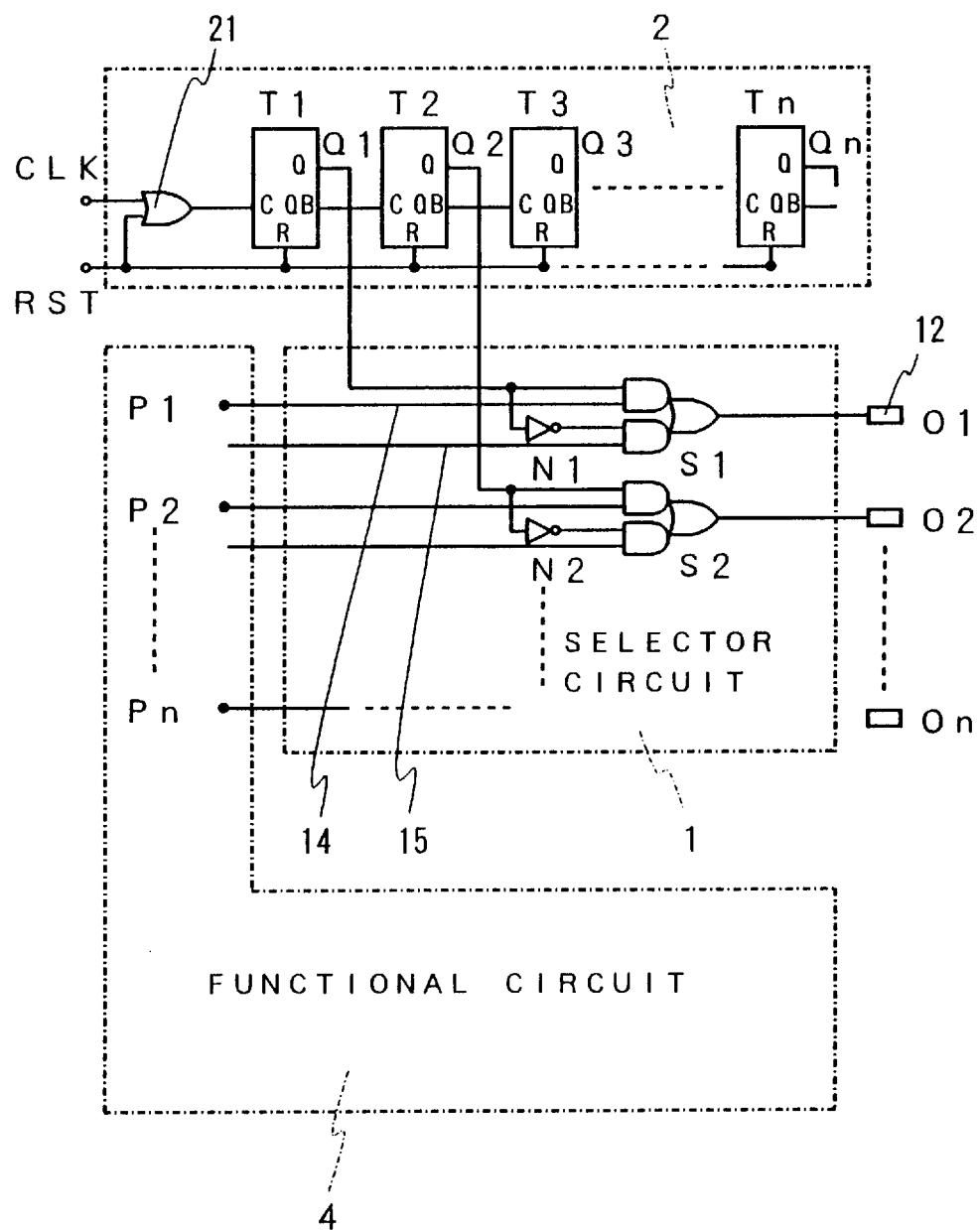
FIG. 1 is an explanatory diagram of one part of a test circuit portion of a semiconductor integrated circuit according to one embodiment of the present invention.

Referring to FIG. 1, there is illustrated a block diagram of a one-chip semiconductor integrated circuit according to one embodiment of the present invention. As shown in the figure, the semiconductor integrated circuit includes, in one chip, a function circuit 4 having particular points P1, P2 . . . Pn, a selector circuit 1 for connecting the particular points P1, P2 . . . Pn of the functional circuit 4 respectively to the electrode pads O1, O2 . . . On, a control circuit 2 for bringing the particular point P1, P2 . . . Pn into connection to and disconnection from the electrode pad O1, O2 . . . On. The control circuit 2 has a counter circuit formed by a plurality of T-type flip-flops T1, T2, T3 . . . Tn in cascade-connection, a reset signal RST input terminal for supplying a reset signal to each flip-flop T1, T2, T3 . . . Tn of the counter circuit, and a clock signal CLK input terminal for supplying a clock signal to the flip-flops T1, T2, T3 . . . Tn. The externally-connecting electrode pads O1, O2 . . . On are provided to adapt for connecting a circuit in which the same integrated circuit is incorporated. These electrode pads O1, O2 . . . On are also connectable to an external testing device or the like, not shown, for conducting a functional test of the particular points P1, P2 . . . Pn on the same integrated circuit.

The selector circuit 1 is formed by switching elements S1, S2 . . . each of which selects a line 15 of a main circuit and a test line 14 which is connected to a monitor point P1, P2 . . . Pn. The switching elements S1, S2 . . . , in FIG. 1 example, are each formed by two AND circuits and an OR circuit. That is, the two AND circuit includes a first AND circuit having inputs of a signal from the monitor point P1, P2 . . . Pn and a control signal from the control circuit 2, and a second AND circuit having inputs of an output of the functional circuit 4 and a control signal inverted by a NOT circuit N1, N2 . . . The OR circuit outputs to the associated electrode pad O1, O2 . . . On either one of outputs of the first AND circuit and the output of the second AND circuit.

The control circuit 2 is for controlling the switching elements S1, S2 . . . , which comprises, for example, T-type flip-flops T1, T2, T3 . . . Tn in cascade connection to have input terminals to which are respectively supplied a reset signal RST and a clock signal CLK. The control circuit thus constitutes a counter circuit that sequentially outputs control signals to the switch elements S1, S2 . . . in dependence upon the number of clock signal pulses. The control circuit 2, when a test is not conducted, is reset by the reset signal RST from the external circuit to have a low level "L" output. When testing, the resetting of the control circuit 4 is canceled and the control circuit is supplied with an appropriate width of a clock pulse through the clock signal CLK input terminal. Reference character 21 denotes a gate circuit that transfers a clock signal CLK when a reset signal RST is at a low level. Each flip-flop has an input terminal C for receiving a reset signal, an input terminal R for receiving a reset signal RST, and an output terminal Q for outputting a signal Q1, Q2 . . . Qn as an output of each flip-flop.

The functional circuit 4 is configured as a combination of logical circuits designed for achieving a functional purpose so that the plurality of monitor points P1, P2 . . . Pn to be tested are provided in the circuits. And the outputs of the functional circuit 4 are connected to the electrode pads (output terminals) O1, O2 . . . On. And between the outputs and the electrode pads, the selector circuit 1 is provided so as to connect the monitor points P1, P2 . . . Pn selectively to the electrode pads O1, O2 . . . On. Thus, when testing, signals on the monitor points P1, P2 . . . Pn are to be outputted to the electrode pads.

Next, the operation of this test circuit will be explained.

When there is no testing, the reset signal RST is at a high level "H", the flip-flops are reset to have a low-level "L" ("0") of an output signal Q, as stated before, so that the first AND circuit, to which monitor point P1, P2 . . . is inputted, of the switching element S1, S2 . . . is inputted by "0" and "1" to have an output of "0". On the other hand, the second AND circuit to which the main circuit line 15 is connected has inputs of "1" and "1" to have an output of "1", since the output signal Q of the flip-flop is inverted by the NOT circuit N1, N2 . . . into a high level "H" ("1"). This output is selected by the OR circuit with the result that the main circuit line 15 is connected to an associated electrode pad O1, O2 . . . On.

When conducting a test, the reset signal RST is brought to a low level "L" to cancel resetting of the control circuit, and a clock signal CLK is supplied through the gate circuit 21. When a first pulse of the clock signal comes, the output Q1 of the first T-type flip-flop T1 becomes a high level "H". Accordingly, the first AND circuit of the switching element S1 to which the monitor point P1 is inputted has inputs of "1" and "1" to thereby have an output of "1". On the other hand, the second AND circuit to which the main circuit connection 15 is inputted has the other input inverted of an output Q1 of the first flip-flop T1 to a low level by the NOT circuit N1, to have inputs "0" and "1", giving an output of "0". Accordingly, the OR circuit for the first switching element S1 gives a monitor-side P1 output so that a signal on the monitor point P1 is outputted on the electrode pad (output terminal) O1.

Then, when a second pulse of the clock signal comes, the output Q2 of the second T-type flip-flop becomes a high level "H". By the combination of "0" and "1" as stated above, the switching element S2 of the selector circuit 1 outputs a monitor point P2 side, outputting the monitor point P2 on the output terminal O2. At this time, on the switching element S1 since the output Q1 of the first flip-flop becomes a low level "L", the output of the first AND circuit to which a monitor point P1 is inputted becomes "0" and the second AND circuit to which the main circuit connection is inputted has an output of "1". Thus, the first switching element S1 selects a main circuit side. As a result, the output terminal O1 has a main circuit output without outputting a monitor point P1 output.

Further, a third pulse of the clock signal comes, both the output Q1 of the first T-type flip-flop T1 and the output Q2 of the second T-type flip-flop T2 become a high level "H". The output terminal O1 and the output terminal O2 respectively have a first monitor point P1 output and a second monitor point P2 output. Further, a fourth clock pulse comes, the output Q3 of the third T-type flip-flop T3 becomes a high level "H" so that a third monitor point, not shown, is outputted to an output terminal (electrode pad). At this time, the first and second T-type flip-flops T1, T2 have respective outputs Q1, Q2 of a low level. The output terminals O1, O2 respectively give main circuit outputs without outputting a monitor point P1, P2 output.

By the number of clock pulses, the selection of the selector circuit 1 can be desirably controlled, monitor points required can be immediately outputted, and principal portions of the integrated circuit can be inspected whether there is present malfunction or not. That is, a test circuit can simply be formed in a complicated integrated circuit by merely providing a clock signal CLK input terminal and a reset signal RST input terminal to a counter circuit formed by T-type flip-flops T1, T2, T3 . . . in cascade connection. Furthermore, the clock signal CLK is also used as a signal for an ordinary circuit other than a test circuit. Accordingly, if such a clock signal CLK is utilized, a test circuit can be formed by providing only one input terminal for the reset signal RST.

Figure 2:
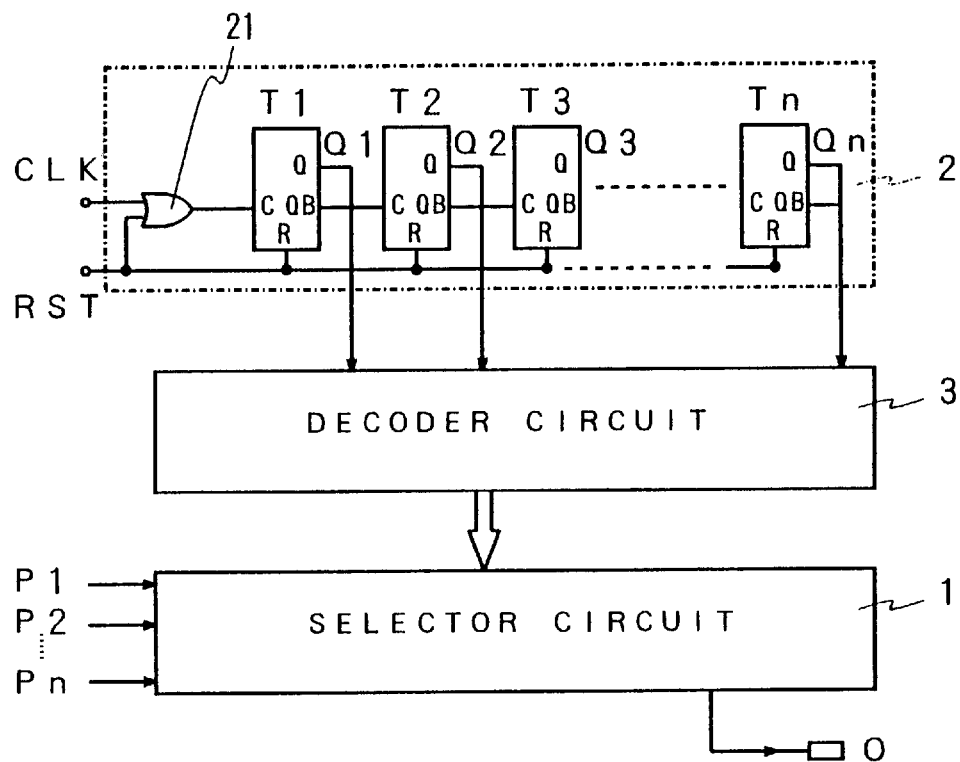
FIGS. 2(a) and 2(b) are explanatory diagram of the test circuit portion of the semiconductor integrated circuit according to another embodiment of the present invention.
Figure 2:
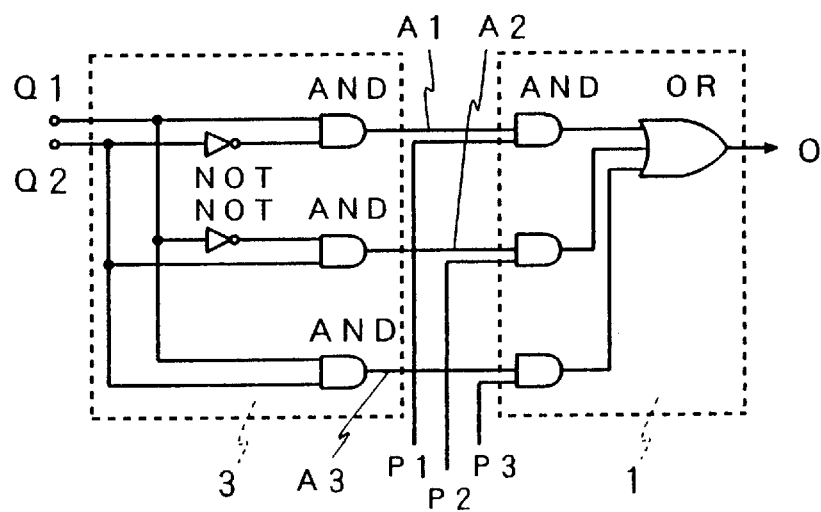
Figure 3:
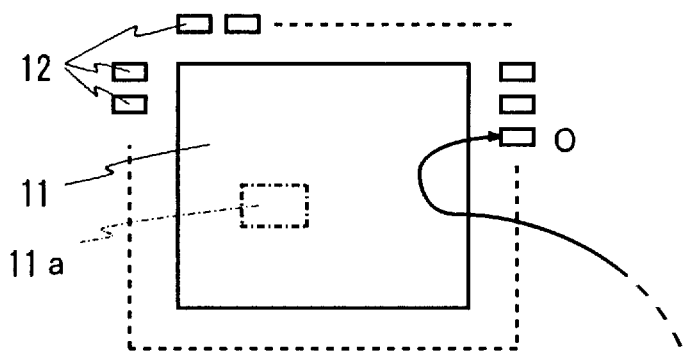
FIGS. 3(a) to 3(c) are explanatory diagram of a test circuit portion of a conventional semiconductor integrated circuit.
Figure 3:
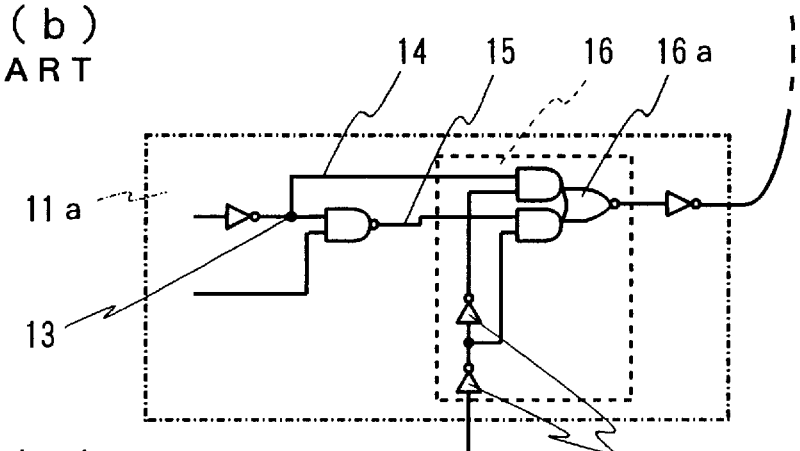
Figure 3:
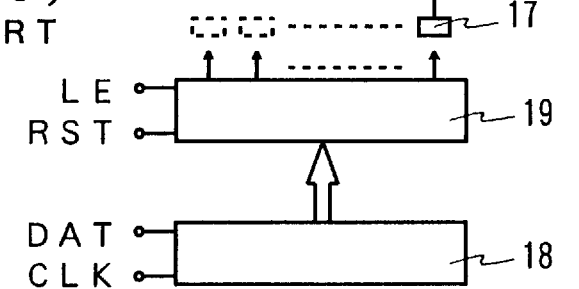

FIG. 2 is a diagram showing another embodiment of the semiconductor integrated circuit of the present invention. In the example shown in FIG. 1, the selection in the selector circuit 1 is made by the combination of outputs "1" and "0" by each counter of the control circuit 2. For example, the first monitor point P1 is outputted by an odd-numbered pulse such as a third pulse, a fifth pulse, and a seventh pulse, besides a first clock pulse. In an example shown in FIG. 2(a), however, the signal to the selector circuit 1 is converted by a decoder circuit 3 such that the first monitor point P1 only is outputted by a first clock pulse, the second monitor point P2 only is outputted by the second clock pulse, and third monitor point P3 only is outputted by a third clock pulse.

FIG. 2(b) shows an example of conversion for only the outputs Q1, Q2 of the first and second T-type flip-flops, for simplification. In FIG. 2(b), as for a first clock pulse, Q1 is at a high level "1" and Q2 is at a low level "0" so that only A1 becomes "1". For a second pulse, Q1 becomes "0" and Q2 becomes "1" so that only A2 is "1". For a third one, both Q1 and Q2 becomes "1" so that only A3 becomes "1". Thus, only a monitor point corresponding to an inputted clock pulse signal can be outputted through the selector circuit 1.

By inserting a decoder circuit 3 like this so as to output a monitor point corresponding to an inputted clock signal, a plurality of monitor points can be obtained on one electrode pad (output terminal) without generating the output on separate electrode pads(output terminals). For example, as shown in FIG. 2(b), the respectively-ordered outputs of the decoder circuit 3 and the monitor points P1, P2, P3 . . . are passed through the selector circuit 1 formed by AND circuits and OR circuits and synchronized to a clock signal, to be time-dividedly outputted on one electrode pad O. By doing so, a plurality of monitor signals can be obtained in order from one electrode pad O, simplifying inspection. In this case, when there are many points to be tested, they can be divided into groups so that outputting is done on the group basis to separate electrodes pads. By doing so, even in a large-scaled integrated circuit there becomes no necessity of increasing electrode pads for testing output terminals.

Although the above embodiment explanation was made solely for the case that internal signals at monitor points are outputted, it is possible to input a test signal to a predetermined internal circuit through an output terminal in accordance with an output of each of flip-flops of the control circuit 2.

According to the present invention, it is possible to reduce input and output terminals for testing, making small the test circuit area in the chip area. Therefore, the package shape of a semiconductor integrated circuit becomes small, the number of pins is reduced, and mounting layout by a user side is facilitated. Semiconductor integrated circuits convenient for use can be obtained inexpensively.

Although preferred embodiments have been described in some detail, it is to be understood that certain changes can be made by those skilled in the art without departing from the spirit and scope of the invention as defined by the appended claims.

What is claimed is:

1. A semiconductor integrated circuit comprising:

a functional circuit formed in a chip;

a selector circuit for connecting monitor points in said functional circuit to electrode pads for external connection, when testing;

a control circuit for supplying to said selector circuit control signals representative of whether or not said monitor points are to be connected by said selector circuit to said electrode pads for external connection;

wherein said control circuit has a counter circuit having a plurality of flip-flops in cascade connection, a clock signal input terminal for supplying a clock signal to the flip-flops in sequence starting from a flip-flop at a forward end in said counter circuit, a reset signal input terminal for supplying a reset signal.

2. A semiconductor integrated circuit according to claim 1, wherein a gate circuit is provided which has input terminals respectively connected to the clock signal and reset signal input terminals so that a clock signal is supplied to said flip-flops by a release from a reset signal only where a test is conducted.

3. A semiconductor integrated circuit according to claim 1, wherein said selector circuit comprises a plurality of switching elements, each of said switching elements is connected between each of said monitor points and each of said electrode pads, each output of said flip-flops is connected to each of said switching elements, and wherein said monitor points are connected to said electrode pads based on the outputs of each of said flip-flops.

4. A semiconductor integrated circuit according to claim 3, wherein each of said switching elements is formed by a first AND circuit having inputs which receive an output of said flip-flops and said monitor points, and a second AND circuit having inputs which receive an inverted output of said flip-flops and an output of said functional circuit, and an OR circuit for transmitting outputs of said first and second AND circuits.

5. A semiconductor integrated circuit according to claim 1, wherein a decoder circuit is connected between said control circuit and said selector circuit, said decoder circuit receiving an output of each of said flip-flops so that an n-th output only is rendered as a high signal correspondingly to the number of pulses "n" of a clock signal inputted to said control circuit.

6. A semiconductor integrated circuit according to claim 5, wherein a plurality of outputs of said selector circuit are delivered to one of said electrode pads, the outputs of said selector circuit being synchronized with a clock signal received by said control circuit to be time-dividedly outputted, whereby some of said monitor points can be detected on said one of said electrode pads.

* * * * *